United States Patent
Lin

(10) Patent No.: US 8,040,119 B2
(45) Date of Patent: Oct. 18, 2011

(54) VALLEY DETECTING CIRCUIT AND METHOD FOR A VOLTAGE ACROSS A SWITCHING DEVICE

(75) Inventor: Tzu-Chen Lin, Taipei (TW)

(73) Assignee: Richtek Technology Corp., Hsinchu (TW)

( * ) Notice: Subject to any disclaimer, the term of this patent is extended or adjusted under 35 U.S.C. 154(b) by 653 days.

(21) Appl. No.: 11/979,390

(22) Filed: Nov. 2, 2007

(65) Prior Publication Data

US 2008/0116870 A1    May 22, 2008

(30) Foreign Application Priority Data

Nov. 3, 2006    (TW) .............................. 95140796 A

(51) Int. Cl.
*G05F 1/46*    (2006.01)
*G05F 1/595*    (2006.01)

(52) U.S. Cl. ...... 323/282; 323/284; 323/285; 363/21.07
(58) Field of Classification Search .................. 323/271, 323/282, 283, 284, 285; 363/21.04, 21.07, 363/21.08
See application file for complete search history.

(56) References Cited

U.S. PATENT DOCUMENTS

2005/0213355 A1*    9/2005    Koike ........................ 363/21.16
* cited by examiner

*Primary Examiner* — Gary L Laxton
*Assistant Examiner* — Nusrat Quddus
(74) *Attorney, Agent, or Firm* — Rosenberg, Klein & Lee

(57) ABSTRACT

A valley detecting circuit and method are provided for a voltage across a switching device, which detect a voltage across the switching device to produce a first voltage proportional to the voltage across the switching device, clamp the first voltage to produce a second voltage, level shift the second voltage to produce a third voltage, and compare the second voltage with the third voltage to determine a valley for the first voltage.

13 Claims, 4 Drawing Sheets

VALLEY DETECTING CIRCUIT AND METHOD FOR A VOLTAGE ACROSS A SWITCHING DEVICE

FIELD OF THE INVENTION

The present invention is related generally to a signal detecting circuit and method, and more particularly, to a valley detecting circuit and method for a voltage across a switching device.

BACKGROUND OF THE INVENTION

An important challenge to the development of the advanced switching mode power supply is to increase the switching frequency of the power switches, because high switching frequency may decrease the size and the weight of a switching mode power supply. However, higher switching frequency results in higher switching loss, and it is therefore required to reduce the switching loss for implementing high switching frequency designs. FIG. 1 shows a conventional quasi-resonance flyback power supply 100, in which a power switch SW1 is serially connected to a primary coil P1 of a transformer TX between a power input Vin and ground GND, a capacitor C1 is shunt to the primary coil P1, and a control circuit 102 switches the power switch SW1 to produce a current on a secondary coil S1 of the transformer TX, in order to charge a capacitor C2 to produce an output voltage Vout.

FIG. 2 is a waveform diagram of the voltage across the power switch SW1 of the power supply 100 shown in FIG. 1. Between time t1 and t2, the power switch SW1 is off, a current flows from the secondary coil S1 through a diode D1 to charge the capacitor C2, and the voltage across the power switch SW1 will clamp to a predetermined value. Between time t2 and t3, the power switch SW1 is still off, the current on the secondary coil S1 is off, and the voltage across the power switch SW1 is resonated due to the presence of the capacitor C1, and thereby produces sinusoidal wave. Between time t3 and t4, the power switch SW1 is on, the voltage across the power switch SW1 falls down. To reduce the switching loss of the power switch SW1, the best timing to turn on the power switch SW1 is when the voltage across the power switch SW1 is at a minimum, that is, the valley of the sinusoidal wave.

Therefore, the key factor of reducing the switching loss is to precisely detect the minimum of the voltage across the power switch SW1. Usually, differentiators are used to detect the minimum of the voltage across the power switch SW1, for example, disclosed by U.S. Pat. No. 6,722,989 to Majid et al. According to the present invention, it is desired to detect the minimum of the voltage across the power switch SW1 without using any differentiator.

SUMMARY OF THE INVENTION

An object of the present invention is to provide a valley detecting circuit and method for a voltage across a switching device.

According to the present invention, a valley detecting circuit and method detect a voltage across a switching device to produce a first voltage proportional to the voltage across the switching device, clamp the first voltage to produce a second voltage, level shift the second voltage to produce a third voltage, and compare the second voltage with the third voltage to determine a valley for the first voltage.

BRIEF DESCRIPTION OF DRAWINGS

These and other objects, features and advantages of the present invention will become apparent to those skilled in the art upon consideration of the following description of the preferred embodiments of the present invention taken in conjunction with the accompanying drawings, in which.

DETAILED DESCRIPTION OF THE INVENTION

Figure 1:
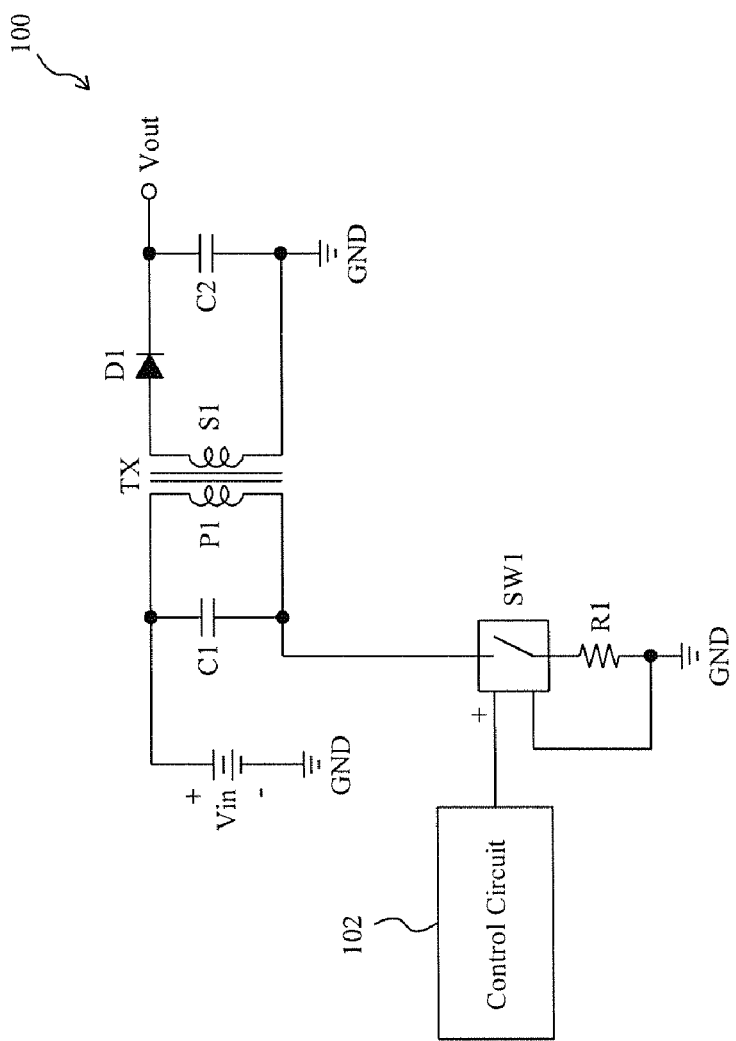
FIG. 1 is a conventional quasi-resonance flyback power supply.
Figure 2:
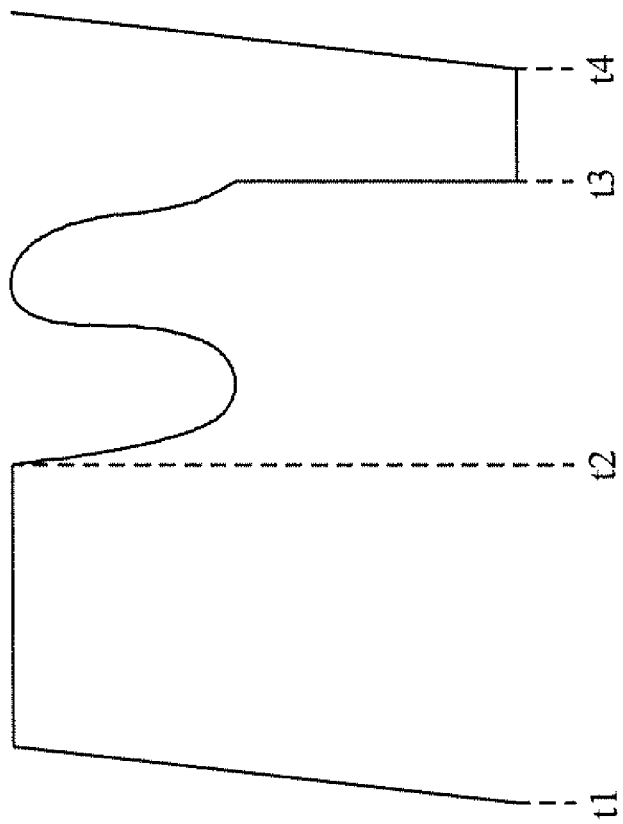
FIG. 2 is a waveform diagram of the voltage across the power switch SW1 of the power supply shown in FIG. 1.
Figure 3:
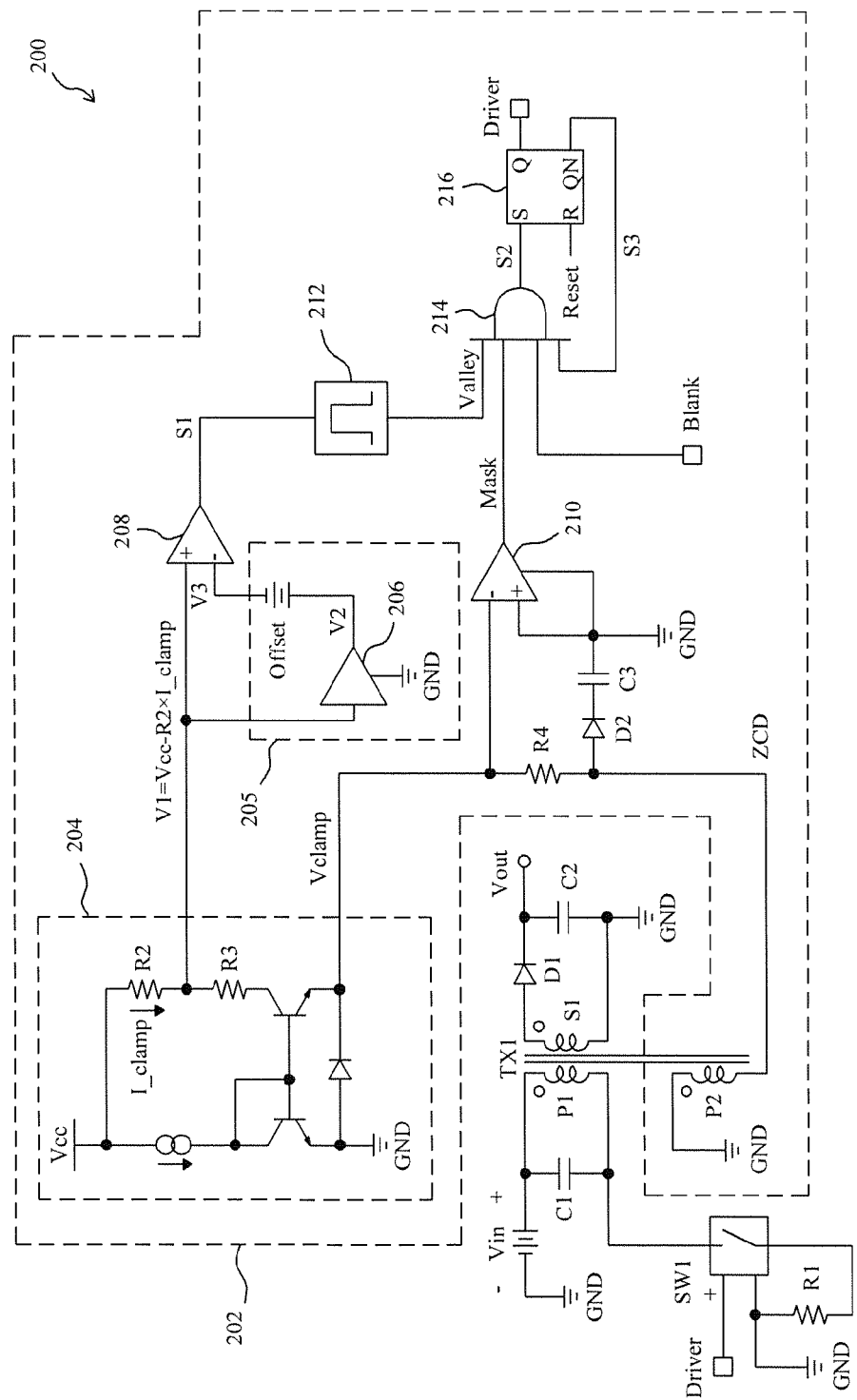
FIG. 3 is an embodiment according to the present invention.

FIG. 3 provides an embodiment according to the present invention, which shows a quasi-resonance flyback power supply 200 designed for illustrating the principle of the present invention. In this circuit 200, a primary coil P1 of a transformer TX1 and a power switch SW1 are connected in series between a power input Vin and ground GND, a control circuit 202 provides a signal Driver to control the power switch SW1, so as to convert the input voltage Vin to an output voltage Vout, and the control circuit 202 has a detecting circuit to detect a valley of the voltage across the power switch SW1. In the detecting circuit, an auxiliary coil P2 provides information concerning the voltage on the power switch SW1, and thereby a detection voltage ZCD is produced, which is proportional to the voltage across the power switch SW1 with an offset. A clamping circuit 204 clamps the voltage ZCD to produce a clamped voltage Vclamp which is above zero and further produces a voltage V1 according to the clamped voltage Vclamp, a level shift circuit 205 level shifts the voltage V1 to produce a voltage V3, a comparator 208 compares the voltage V1 with the voltage V3 to produce a comparison signal S1 which will change from low to high when the voltage V1 goes to a valley, so as to trigger a positive edge trigger 212 to produce a signal Valley, a comparator 210 has two inputs connected with the voltage Vclamp and to ground GND, in order to produce a blanking signal Mask which will have a low level when the voltage Vclamp is higher than zero, and have a high level otherwise. An AND gate 214 functions as a blanking circuit for producing a signal S2 according to the blanking signal Mask, a blanking signal Blank produced from the interior of the control circuit 202, the signal Valley, and a signal S3 from an output QN of a flip-flop 216, to serve as the set input S of the flip-flop 216. In the level shift circuit 205, a buffer 206 delays the voltage V1 to produce a voltage V2, and a voltage source Offset is used to level shift the voltage V2 to produce the voltage V3. In other embodiments, it may directly detect the voltage across the power switch SW1, but not by the auxiliary coil P2. In this embodiment, the blanking signal Mask is used to blank the improper signal Valley, so as to prevent the power switch SW1 from being turned on when the voltage across the power switch SW1 is not at a valley, and the blanking signal Blank is used to determine which valley in the voltage across the power switch SW1 is desired to turn on the power switch SW1.

Figure 4:
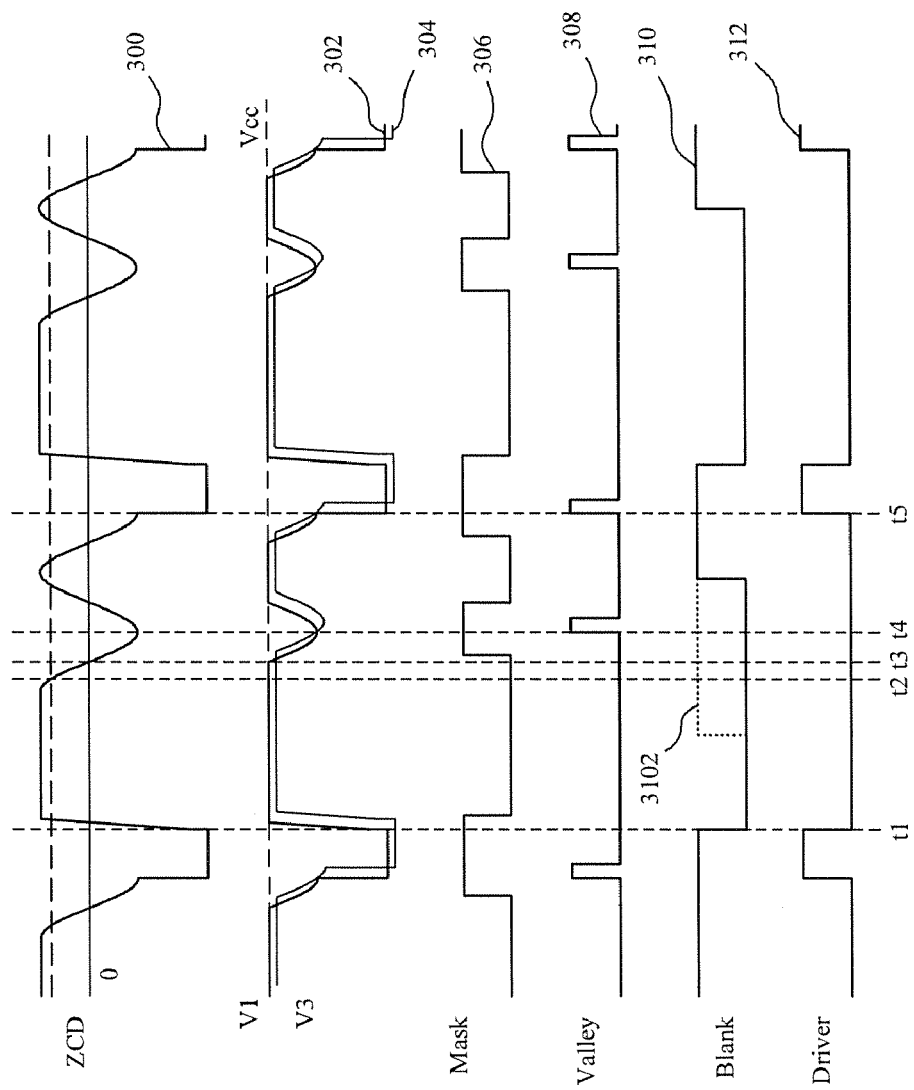
FIG. 4 is a waveform diagram of showing different signals in the circuit shown in FIG. 3.

FIG. 4 is a waveform diagram of showing various signals in the circuit 200 shown in FIG. 3, in which waveform 300 represents the voltage ZCD, waveform 302 represents the voltage V1, waveform 304 represents the voltage V3, waveform 306 represents the blanking signal Mask, waveform 308 represents the signal Valley, waveform 310 represents the blanking signal Blank, and waveform 312 represents the signal Driver. With reference to FIGS. 3 and 4, in this embodiment, the clamping circuit 204 limits the clamped voltage Vclamp above a minimum which is 0 volt hereof, and further produces a current I_clamp accordingly which flows through a resistor R2 such that V1=Vcc−R2×I_clamp, and the voltage V1 is further delayed by the buffer 206 and level shifted by the voltage source Offset to produce the voltage V3, as shown in the waveform 304. Between time t1 and t2, the power switch SW1 is off, a current is conducted on the secondary coil S1, so the voltage ZCD rises up, as shown in the waveform 300, while between time t2 and t5, the power switch SW1 is still off, the current on the secondary coil S1 is off, and the voltage ZCD across the power switch SW1 is resonated due to the presence of the capacitor C1, and produces sinusoidal wave in the waveform 300. At time t3, the voltage Vclamp is equal to 0, the output Mask of the comparator 210 is supposed to change its level immediately, but it is delayed a bit for avoiding the error action of the comparator 208 when the voltage V1 and the voltage V3 cross over with each other later. At time t4, the waveforms 302 and 304 of the voltages V1 and V3 cross over with each other at a valley of the voltage V1, and the signal S1 produced by the comparator 208 changes from low to high, thereby triggering the positive edge trigger 212 to produce the signal Valley, as shown in the waveform 308. The inputs of the AND gate 214 are connect with the signals Valley, Mask, Blank, and S3. At time t4, the signal Valley, the signal Mask, and the output QN of the flip-flop 216 are high level, the signal Blank is low level, so the signal S2 keeps at low level, which will not trigger the flip-flop 216, thereby remaining the signal Driver at low level, as shown in the waveform 312. At time t5, the voltages V1 and V3 cross over with each other at another valley of the voltage V1 again, and the signals Valley, Mask, Blank, and S3 are all high level, so the signal S2 changes from low to high, which will trigger the flip-flop 216 to produce the signal Driver having a high level to turn on the power switch SW1.

As mentioned in the above description, the blanking signal Blank may be changed to determine which valley of the sinusoidal wave for the power switch SW1 to be turned on. For example, if the waveform 310 of the blanking signal Blank is changed to be the dotted line 3102, the power switch SW1 will be turned on when the first valley of the sinusoidal wave appears.

While the present invention has been described in conjunction with preferred embodiments thereof, it is evident that many alternatives, modifications and variations will be apparent to those skilled in the art. Accordingly, it is intended to embrace all such alternatives, modifications and variations that fall within the spirit and scope thereof as set forth in the appended claims.

What is claimed is:

1. A valley detecting circuit for a voltage across a switching device, comprising:
    a voltage detector for detecting the voltage across the switching device to produce a first voltage proportional to the voltage across the switching device;
    a clamping circuit for clamping the first voltage to produce a second voltage;
    a level shift circuit for shifting the second voltage in level and time to produce a third voltage, the second and third voltages remaining proportional to the voltage across the switching device; and
    a determining circuit for comparing the second voltage with the third voltage to determine a valley for the first voltage.

2. The valley detecting circuit of claim 1, wherein the level shift circuit comprises a buffer for delaying the second voltage to produce the third voltage.

3. The valley detecting circuit of claim 1, wherein the level shift circuit comprises:
    a buffer for delaying the second voltage to produce a fourth voltage; and
    a voltage source for shifting the fourth voltage to produce the third voltage.

4. The valley detecting circuit of claim 1, wherein the determining circuit comprises;
    a comparator for comparing the second voltage with the third voltage to produce a comparison signal;
    a positive edge trigger for producing a first signal in response to the comparison signal; and
    a blanking circuit for blanking the first signal in response to a blanking signal to produce a second signal.

5. The valley detecting circuit of claim 4, wherein the blanking circuit comprises an AND gate having two inputs connected with the first signal and the blanking signal, respectively.

6. The valley detecting circuit of claim 5, further comprising a second comparator for comparing the second voltage with a reference voltage to produce the blanking signal.

7. The valley detecting circuit of claim 4, wherein the blanking signal selectively blanks the first signal, so as to select one from a plurality of valleys as the determined valley.

8. A valley detecting method for a voltage across a switching device, comprising the steps of:
    detecting the voltage across the switching device for producing a first voltage proportional to the voltage across the switching device;
    clamping the first voltage for producing a second voltage;
    level shifting the second voltage in level and time for producing a third voltage; and
    comparing the second voltage with the third voltage for determining a valley for the first voltage, the second and third voltages remaining proportional to the voltage across the switching device.

9. The valley detecting method of claim 8, wherein the step of clamping the first voltage for producing a second voltage comprises the step of limiting the second voltage above a minimum.

10. The valley detecting method of claim 8, wherein the step of level shifting the second voltage for producing a third voltage comprises the step of delaying the second voltage for producing the third voltage.

11. The valley detecting method of claim 8, wherein the step of level shifting the second voltage for producing a third voltage comprises the steps of:
    delaying the second voltage for producing a fourth voltage; and
    level sifting the fourth voltage for producing the third voltage.

12. The valley detecting method of claim 8, wherein the step of comparing the second voltage with the third voltage for determining a valley for the first voltage comprises the step of triggering a signal indicating that the first voltage is at a valley once the second voltage is rising to cross over the third voltage.

13. The valley detecting method of claim 12, further comprising the step of selectively blanking the triggered signal, so as to select one from a plurality of valleys as the determined valley.

* * * * *